United States Patent
Nayak et al.

(10) Patent No.: US 12,260,979 B2
(45) Date of Patent: Mar. 25, 2025

(54) THERMAL MANAGEMENT OF PLANAR TRANSFORMER WINDINGS AND CORES

(71) Applicant: Hamilton Sundstrand Corporation, Charlotte, NC (US)

(72) Inventors: Hebri Vijayendra Nayak, Rockford, IL (US); Scott C. Wohlfarth, Edgerton, WI (US)

(73) Assignee: HAMILTON SUNDSTRAND CORPORATION, Charlotte, NC (US)

( * ) Notice: Subject to any disclaimer, the term of this patent is extended or adjusted under 35 U.S.C. 154(b) by 982 days.

(21) Appl. No.: 17/220,093

(22) Filed: Apr. 1, 2021

(65) Prior Publication Data
US 2021/0313107 A1 Oct. 7, 2021

Related U.S. Application Data

(60) Provisional application No. 63/003,493, filed on Apr. 1, 2020.

(51) Int. Cl.
*H01F 27/06* (2006.01)
*H01F 27/22* (2006.01)
(Continued)

(52) U.S. Cl.
CPC ......... *H01F 27/2804* (2013.01); *H01F 27/06* (2013.01); *H01F 27/22* (2013.01);
(Continued)

(58) Field of Classification Search
CPC ............. H01F 27/2804; H01F 17/0006; H01F 17/0013; H01F 2027/2809; H01F 5/003;
(Continued)

(56) References Cited

U.S. PATENT DOCUMENTS

| 5,634,262 A | 6/1997 | O'Donnell et al. |
| 5,929,735 A * | 7/1999 | Heinrich ................. H01F 30/16 336/61 |

(Continued)

FOREIGN PATENT DOCUMENTS

| EP | 1486994 A1 * | 12/2004 | ........... H01F 17/062 |
| EP | 3121827 A1 * | 1/2017 | ........... G09G 3/2092 |

(Continued)

OTHER PUBLICATIONS

The Extended European Search Report for Application No. 21165394. 4-1212; Report Issued: Aug. 27, 2021; Report Received: Sep. 30, 2021; 4 pages.

*Primary Examiner* — Tszfung J Chan
(74) *Attorney, Agent, or Firm* — CANTOR COLBURN LLP

(57) ABSTRACT

A two-card assembly includes: a first printed wiring board; a second printed wiring board; a first stiffener secured to the first printed wiring board, the first stiffener interposed between the first printed wiring board and the second printed wiring board; a second stiffener secured to the second printed wiring board, the second stiffener interposed between the first stiffener and second printed wiring board; a transformer mounting plate interposed between the first stiffener and the second stiffener; and a planar transformer secured to the transformer mounting plate. The transformer mounting plate dissipates heat from the planar transformer.

12 Claims, 18 Drawing Sheets

(51) Int. Cl.
*H01F 27/28* (2006.01)
*H05K 1/18* (2006.01)

(52) U.S. Cl.
CPC ....... *H05K 1/181* (2013.01); *H01F 2027/065* (2013.01); *H01F 2027/2819* (2013.01); *H05K 2201/086* (2013.01)

(58) Field of Classification Search
CPC ............... H01F 27/06; H01F 2027/065; H01F 2027/2819; H01F 27/292; H01F 2005/046; H01F 27/027; H01F 2027/2814; H01F 27/08; H01F 27/22; H01F 27/2876; H05K 1/181; H05K 2201/086
USPC .................................................. 336/200, 232
See application file for complete search history.

(56) References Cited

U.S. PATENT DOCUMENTS

| | | | |
|---|---|---|---|
| 6,212,075 B1 | 4/2001 | Habing et al. | |
| 6,246,582 B1 | 6/2001 | Habing et al. | |
| 6,466,454 B1 | 10/2002 | Jitaru | |
| 6,570,250 B1 | 5/2003 | Pommer | |
| 6,775,141 B2 | 8/2004 | Yoshida et al. | |
| 8,477,498 B2 | 7/2013 | Porreca et al. | |
| 8,498,124 B1* | 7/2013 | Folker | H01F 27/06 361/740 |
| 8,629,746 B2* | 1/2014 | Lu | H01F 27/36 336/212 |
| 9,041,502 B2 | 5/2015 | Ansari et al. | |
| 10,070,562 B2 | 9/2018 | Lassini et al. | |
| 10,497,506 B2 | 12/2019 | Massolini et al. | |
| 10,892,083 B1 | 1/2021 | Nayak et al. | |
| 2005/0270745 A1* | 12/2005 | Chen | H01F 27/2804 361/707 |
| 2007/0159289 A1* | 7/2007 | Lee | H01F 27/24 336/212 |
| 2011/0140258 A1* | 6/2011 | Do | H01L 25/105 257/E21.511 |
| 2012/0099288 A1* | 4/2012 | Parish | H05K 1/145 29/832 |
| 2013/0077276 A1* | 3/2013 | Kippley | H02M 7/003 361/784 |
| 2016/0064134 A1* | 3/2016 | Yeo | H01F 27/22 336/61 |
| 2020/0098502 A1* | 3/2020 | Serizawa | H01F 41/122 |

FOREIGN PATENT DOCUMENTS

| | | | | |
|---|---|---|---|---|
| GB | 2484742 A | | 4/2012 | |
| JP | S6119109 A | | 1/1986 | |
| JP | 08064439 A | * | 3/1996 | |
| JP | 2000353627 A | * | 12/2000 | |
| WO | WO-2005086185 A1 | * | 9/2005 | ............. H01F 27/22 |
| WO | WO-2017149062 A1 | * | 9/2017 | ............. H01F 27/24 |

* cited by examiner

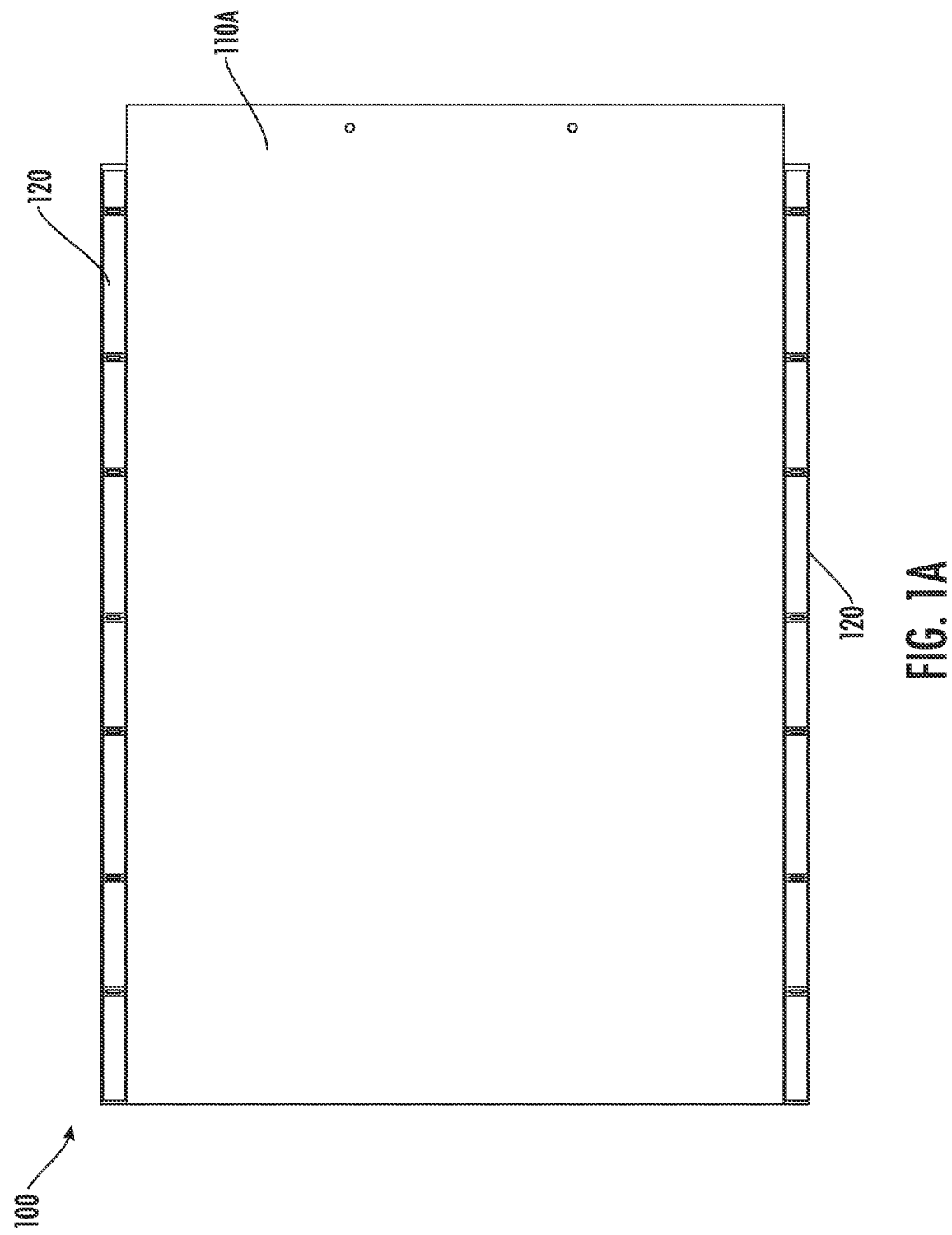

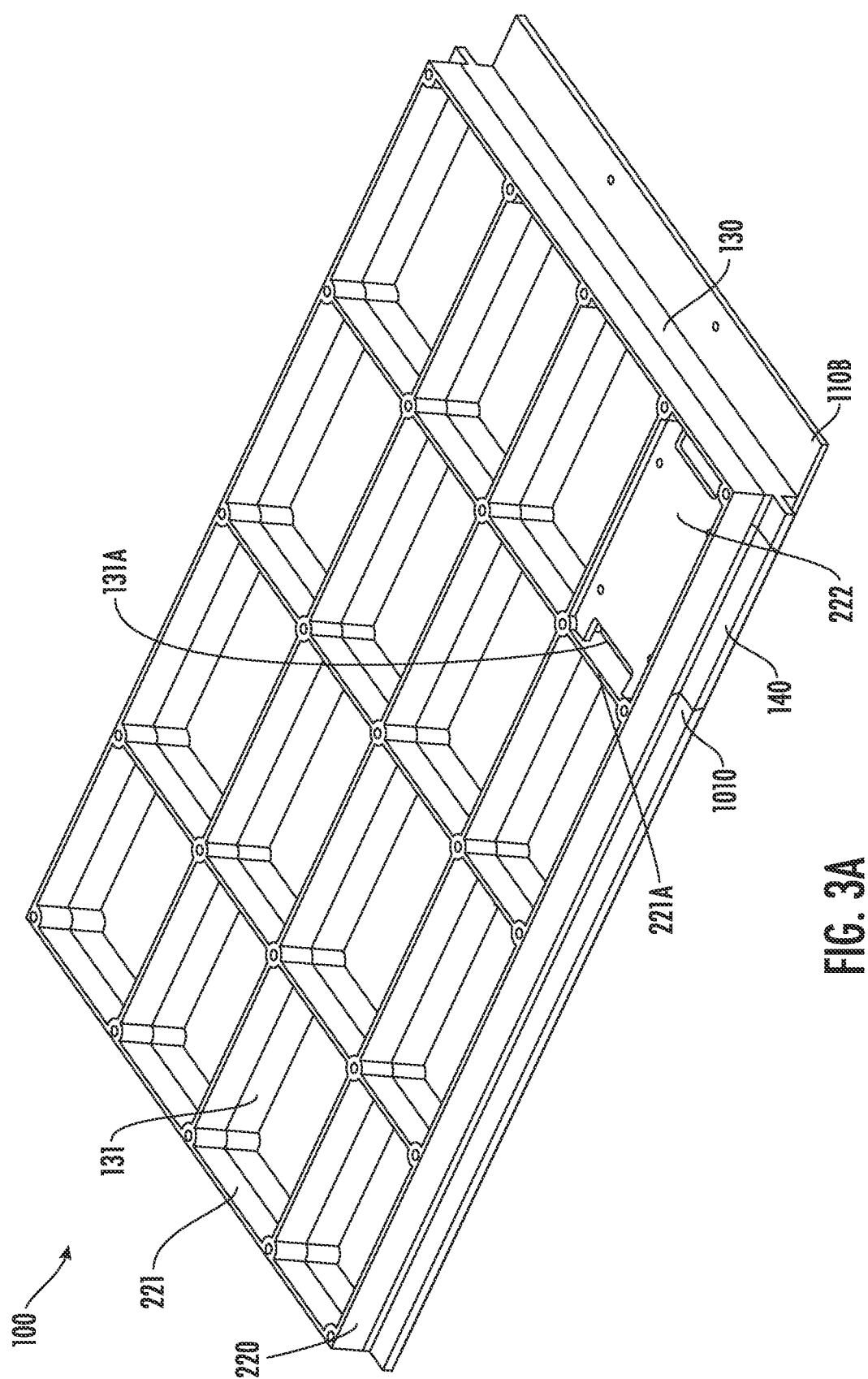

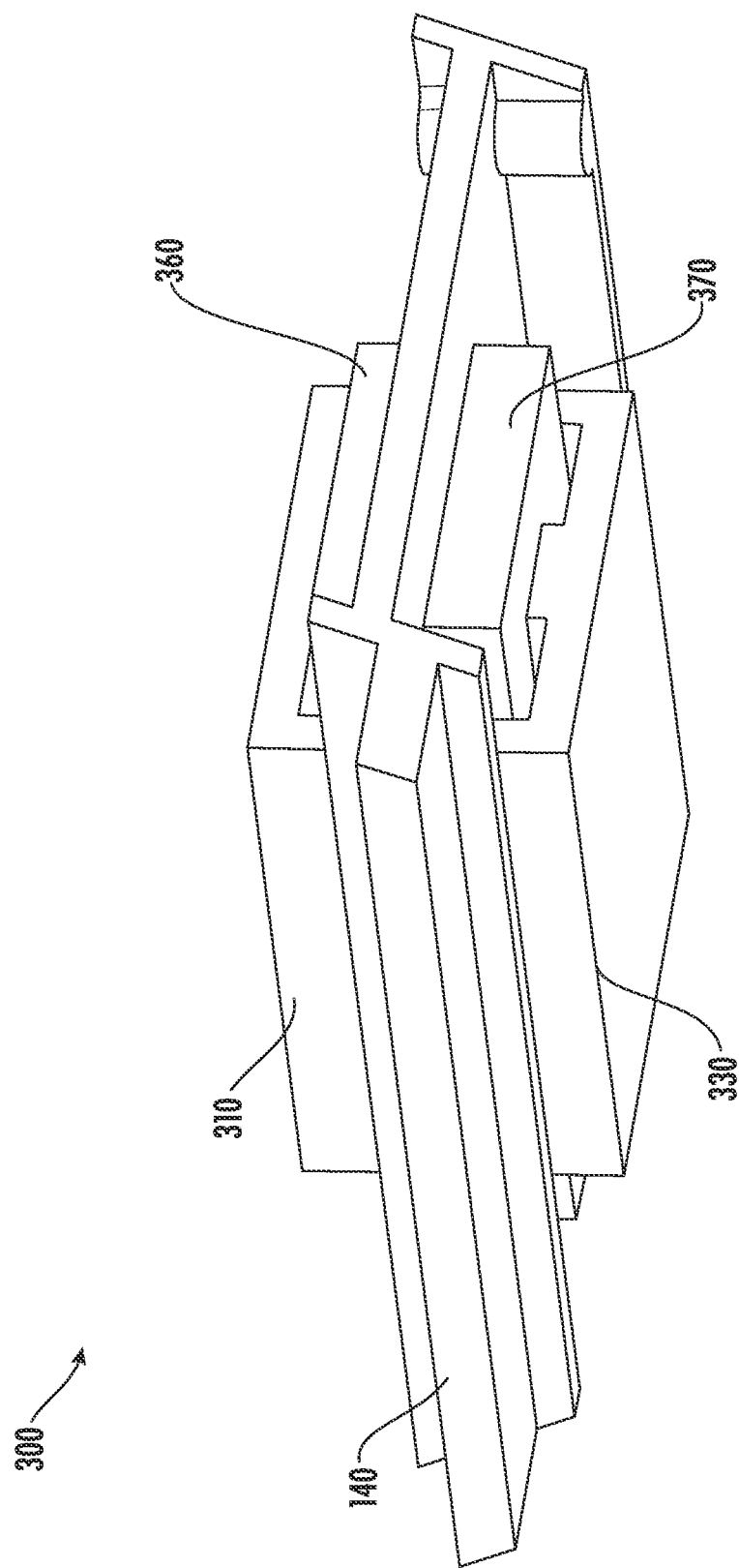

THERMAL MANAGEMENT OF PLANAR TRANSFORMER WINDINGS AND CORES

CROSS-REFERENCE TO RELATED APPLICATIONS

This application claims the benefit of U.S. Provisional Application No. 63/003,493 filed Apr. 1, 2020, the disclosure of which is incorporated herein by reference in its entirety.

BACKGROUND

Exemplary embodiments pertain to the art of electronic modules and, in particular, to a conductive thermal management architecture for electronic modules in a two-card assembly.

In a broad range of applications, electronic components are packaged as electronic modules. The electronic modules are supported and interconnected with printed wiring boards (PWBs). A two-card assembly, for example, refers to two PWBs stacked with electronic modules between them. Typically, electronic components placed directly on a PWB dissipate heat through the PWB. Electronic modules dissipate heat from a side that is opposite the side in contact with the PWB.

BRIEF SUMMARY

According to one embodiment, a two-card assembly is provided. The two-card assembly includes: a first printed wiring board; a second printed wiring board; a first stiffener secured to the first printed wiring board, the first stiffener interposed between the first printed wiring board and the second printed wiring board: a second stiffener secured to the second printed wiring board, the second stiffener interposed between the first stiffener and second printed wiring board: a transformer mounting plate interposed between the first stiffener and the second stiffener; and a planar transformer secured to the transformer mounting plate. The transformer mounting plate dissipates heat from the planar transformer.

In addition to one or more of the features described above, or as an alternative, further embodiments may include that the transformer mounting plate dissipates heat from a center of the planar transformer.

In addition to one or more of the features described above, or as an alternative, further embodiments may include that the transformer mounting plate further includes: a first surface; a second surface opposite the first surface: a central opening extending from the first surface to the second surface: a first outer opening extending from the first surface to the second surface; and a second outer opening extending from the first surface to the second surface. The central opening is interposed between the first outer opening and the second outer opening.

In addition to one or more of the features described above, or as an alternative, further embodiments may include that the transformer mounting plate further includes: a slot extending from the first surface to the second surface, the slot connects the central opening to at least one of the first outer opening and the second outer opening.

In addition to one or more of the features described above, or as an alternative, further embodiments may include that the planar transformer further includes: a first core: a second core opposite the first core: a first winding interposed between the first core and the transformer mounting plate, the first winding being in contact with the first surface of the transformer mounting plate; and a second winding interposed between the second core and the transformer mounting plate, the second winding being in contact with the second surface of the transformer mounting plate.

In addition to one or more of the features described above, or as an alternative, further embodiments may include that the first core further includes: a central core leg extending through the central opening of the transformer mounting plate: a first outer core leg extending through the first outer opening of the transformer mounting plate; and a second outer leg extending through the second outer opening of the transformer mounting plate.

In addition to one or more of the features described above, or as an alternative, further embodiments may include that the first winding is wrapped circumferentially around the central core leg of the first core.

In addition to one or more of the features described above, or as an alternative, further embodiments may include that the second core further includes: a central core leg of the second core, the central core leg of the first core aligns with the central core leg of the second core: a first outer core leg of the second core, the first outer core leg of the first core aligns with the first outer core leg of the second core; and a second outer core leg of the second core, the second outer core leg of the first core aligns with the second outer core leg of the second core.

In addition to one or more of the features described above, or as an alternative, further embodiments may include that the second winding is wrapped circumferentially around the central core leg of the first core and the central core leg of the second core.

In addition to one or more of the features described above, or as an alternative, further embodiments may include that the central core leg of the first core, the first outer core leg of the first core, and the second outer core leg of the first core each have a length equivalent to a first length. The central core leg of the second core, the first outer core leg of the second core, and the second outer core leg of the second core each have a length equivalent to a second length. The first length is greater than the second length.

In addition to one or more of the features described above, or as an alternative, further embodiments may include that the transformer mounting plate further includes a wedge lock mounting rail.

In addition to one or more of the features described above, or as an alternative, further embodiments may include that the second stiffener further includes a wedge lock mount rail, the wedge lock mounting rail of the transformer mounting plate aligns with the wedge lock mount rail of the second stiffener.

In addition to one or more of the features described above, or as an alternative, further embodiments may include that the second stiffener further includes a slot, the transformer mounting plate fits into the slot.

In addition to one or more of the features described above, or as an alternative, further embodiments may include that the slot further includes a first angled side and a second angled side. The transformer mounting plate includes a first angled side of the transformer mounting plate and a second angled side of the transformer mounting plate. The first angled side of the slot mirrors the first angled side of the transformer mounting plate and the second angled side of the slot mirrors the second angled side of the transformer mounting plate.

According to another embodiment, a method of assembling a two-card assembly is provided. The method including: securing a first printed wiring board to a first stiffener: securing a second printed wiring board to a second stiffener: securing a planar transformer to a transformer mounting plate; and inserting the transformer mounting plate between the first stiffener and the second stiffener.

In addition to one or more of the features described above, or as an alternative, further embodiments may include: inserting the transformer mounting plate into a slot of the second stiffener.

In addition to one or more of the features described above, or as an alternative, further embodiments may include: securing the transformer mounting plate in the slot of the second stiffener using fasteners.

In addition to one or more of the features described above, or as an alternative, further embodiments may include: fabricating the transformer mounting plate. The transformer mounting plate including: a first surface: a second surface opposite the first surface: a central opening extending from the first surface to the second surface: a first outer opening extending from the first surface to the second surface; and a second outer opening extending from the first surface to the second surface. The central opening is interposed between the first outer opening and the second outer opening.

In addition to one or more of the features described above, or as an alternative, further embodiments may include: inserting a central core leg of a first core into the central opening: inserting a first outer core leg of the first core into the first outer opening; and inserting a second outer core leg of the first core into the second outer opening.

In addition to one or more of the features described above, or as an alternative, further embodiments may include: wrapping a first winding circumferentially around the central core leg of the first core, the first winding in contact in the first surface of the transformer mounting plate; and wrapping a second winding circumferentially around the central core leg of the first core, the second winding in contact in the second surface of the transformer mounting plate.

The foregoing features and elements may be combined in various combinations without exclusivity, unless expressly indicated otherwise. These features and elements as well as the operation thereof will become more apparent in light of the following description and the accompanying drawings. It should be understood, however, that the following description and drawings are intended to be illustrative and explanatory in nature and non-limiting.

BRIEF DESCRIPTION

The following descriptions should not be considered limiting in any way. With reference to the accompanying drawings, like elements are numbered alike:

FIG. 1A illustrates a top view of an exemplary two-card assembly, in accordance with an embodiment of the present disclosure:

FIG. 3A illustrates an isometric view of the two-card assembly shown in FIG. 2 with a first printed wiring board removed, in accordance with an embodiment of the present disclosure;

FIG. 4A illustrates an isometric view of a transformer mounting plate and a planar transformer of the two-card assembly, in accordance with an embodiment of the present disclosure:

DETAILED DESCRIPTION

A detailed description of one or more embodiments of the disclosed apparatus and method are presented herein by way of exemplification and not limitation with reference to the Figures.

As previously noted, electronic modules on a printed wiring board (PWB) dissipate heat from a side opposite the side that is in contact with the PWB. If the heat-dissipating side of the electronic modules could be exposed, air cooling would be possible if air is available. However, in the two-card assembly, the electronic modules are sandwiched between two PWBs and, thus, there is typically no way to dissipate heat from a center of the two-card assembly. Embodiments of the invention relate to a conductive thermal management architecture through a center of a planar transformer in a two-card assembly.

Figure 1B:
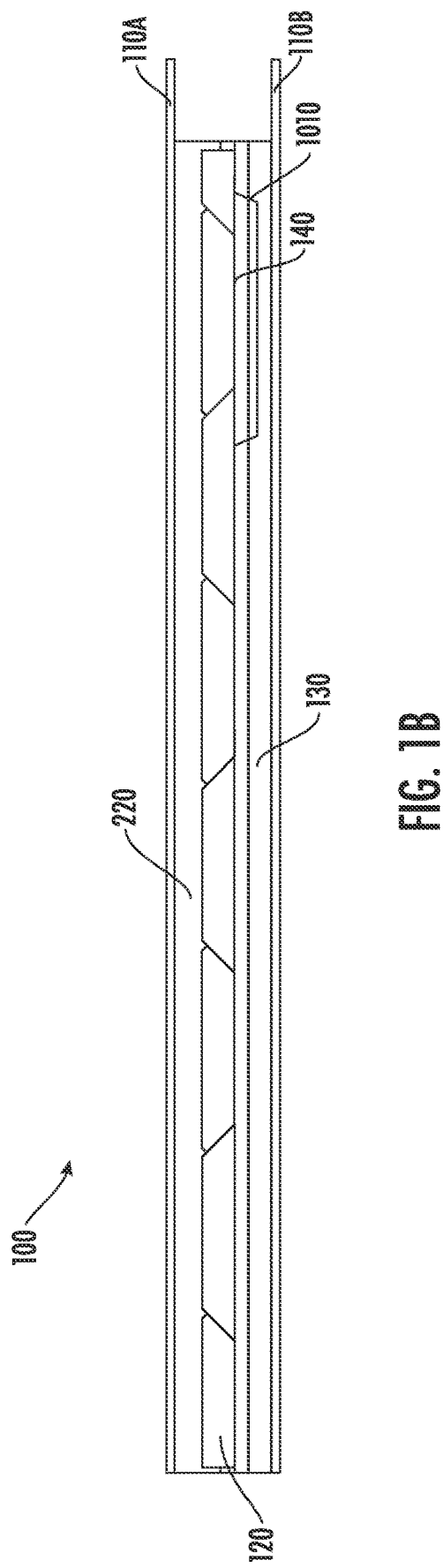
FIG. 1B illustrates a side view of the two-card assembly shown in FIG. 1A, in accordance with an embodiment of the present disclosure.

Referring now to FIGS. 1A and 1B, a two-card assembly 100 is illustrated, in accordance with an embodiment of the present disclosure. The terms "first" and "second" are used only for explanatory purposes and do not limit the orientation of the two-card assembly 100 in any way. FIG. 1A illustrates a top view of a two-card assembly 100 in which a first PWB 110a is visible. Wedge locks 120 are also visible in the view of FIG. 1A. These wedge locks 120 are used to secure the two-card assembly 100 inside the chassis of an electronic box.

FIG. 1B illustrates a side view of the two-card assembly 100 as FIG. 1A in which a second PWB 110b and the first PWB 110a are visible. A second stiffener 130 and a first stiffener 220 are interposed between the first PWB 110a and the second PWB 110b, as illustrated in FIG. 1B. The first stiffener 220 is interposed between the first PWB 110a and the second PWB 110b. The second stiffener 130 is interposed between the first stiffener 220 and the second PWB 110b. A transformer mounting plate 140 fits into a slot 1010 of the second stiffener 130, as illustrated in FIGS. 1B and 1s sandwiched between the first stiffener 220 and the second stiffener 130. The second stiffener 130, the first stiffener 220, and the transformer mounting plate 140 are all fabricated from thermally conductive material. The second stiffener 130 and the first stiffener 220 may all be fabricated from aluminum alloy or any other thermally-conductive material. For example, 2000, 6000, or 7000 series aluminum alloys may be used. The transformer mounting plate 140 may be made of an aluminum alloy or any other thermally-conductive material.

Figure 2:
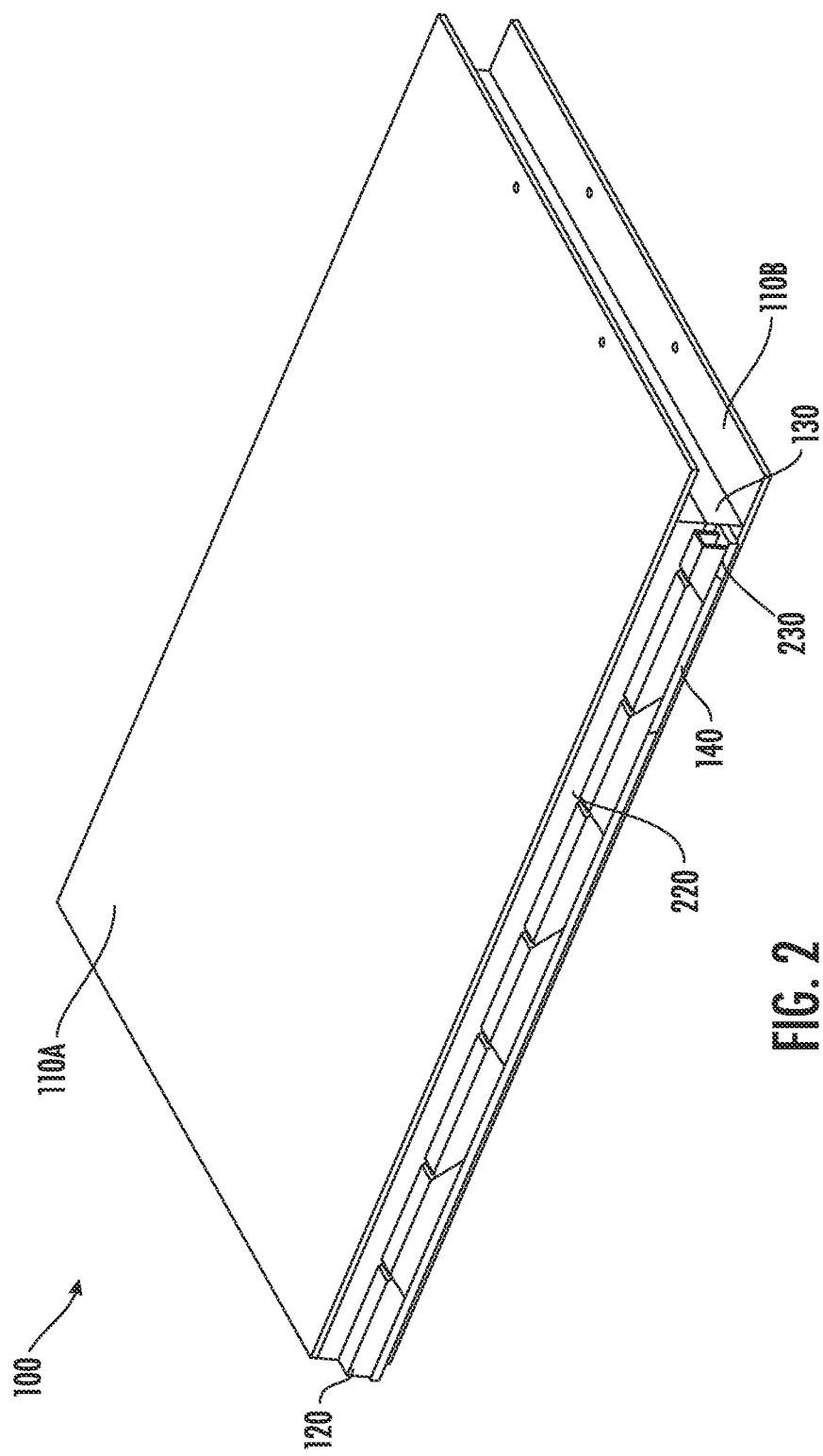
FIG. 2 illustrates an isometric view of the two-card assembly shown in FIGS. 1A and 1B, in accordance with an embodiment of the present disclosure.

Referring now to FIG. 2, with continued reference to the previous FIGS., an isometric view of the two-card assembly 100 is illustrated, in accordance with an embodiment of the present disclosure. The view illustrated in FIG. 2 exposes components between the first PWB 110a and the second PWB 110b. The wedge locks 120 and the wedge lock mount rail 230 on the two-card assembly 100 are shown. As previously noted, the wedge locks 120 are used to secure the two-card assembly 100 in a chassis of an electronic box. Torque is applied on a wedge lock screw (not shown) to install the wedge locks 120 in the chassis. The wedge lock screw torque subjects the wedge locks 120 to both axial and normal force. The normal force is transferred to the second stiffener 130 and the transformer mounting plate 140 as a compressive force that ensures that the transformer mounting plate 140 is held firmly in the slot 1010 (FIG. 1B) of the second stiffener 130. While the second stiffener 130 is secured (i.e., bonded) to the second PWB 110b and the first stiffener 220 is secured (i.e., bonded) to the first PWB 110a, the transformer mounting plate 140, which sits in a slot 1010 (FIG. 1B) of the second stiffener 130, is only held in place by the wedge locks 120. As a result, the transformer mounting plate 140 is easily removable so that the planar transformer 300 attached to the transformer mounting plate 140 can be repaired or replaced. The transformer mounting plate 140 sits in a slot 1010 (FIG. 1B) of the second stiffener 130.

Figure 3B:
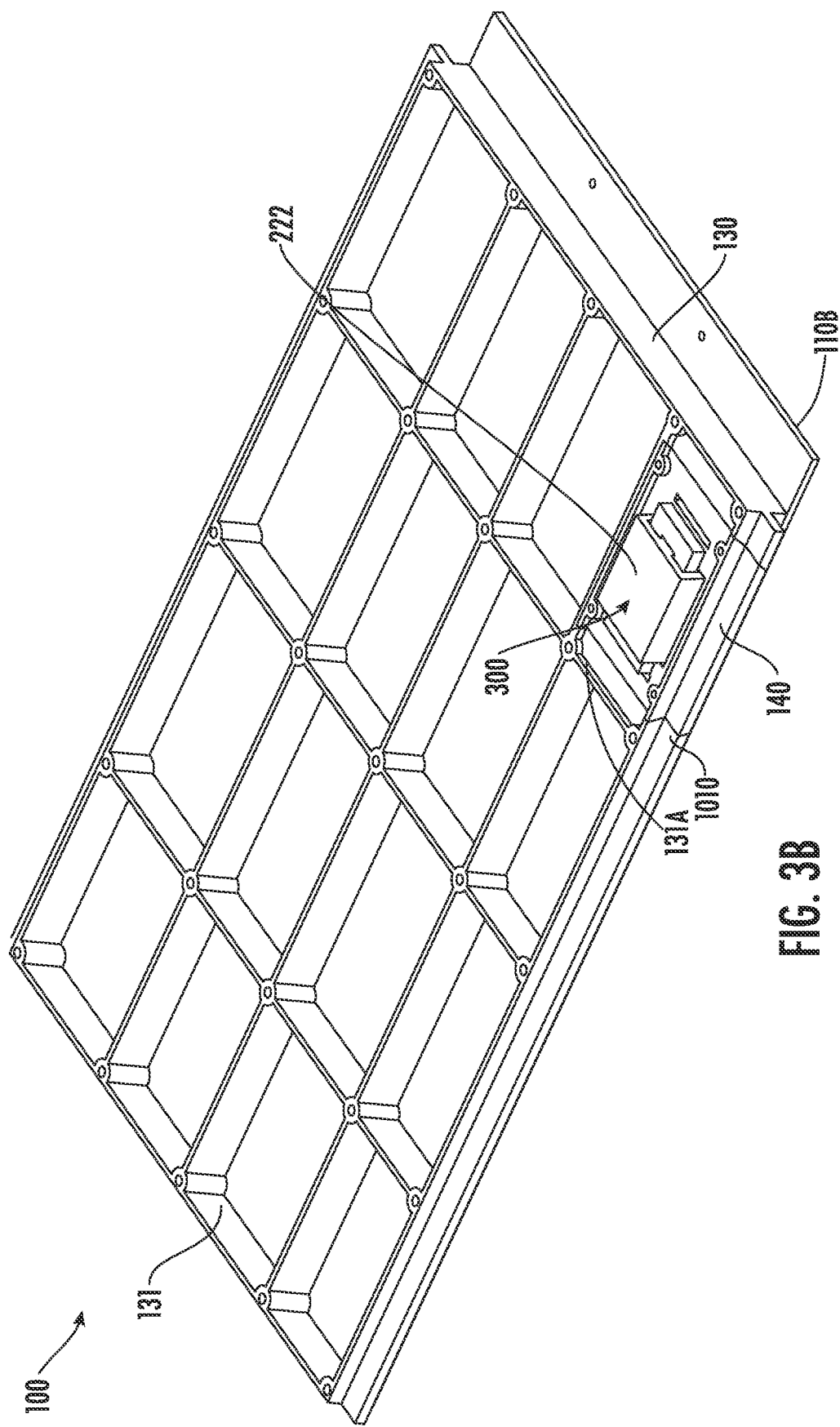
FIG. 3B illustrates an isometric view of the two-card assembly shown in FIG. 3A with the first stiffener removed, in accordance with an embodiment of the present disclosure.

Referring now to FIGS. 3A and 3B, with continued reference to the previous FIGS., the isometric inner views of the two-card assembly 100 are illustrated, according to an embodiment of the present disclosure. FIG. 3A is a sectional isometric view of an exemplary two-card assembly 100 with the first PWB 110a (FIG. 2) removed. FIG. 3B is an isometric view of an exemplary two-card assembly 100 with the first PWB 110a (FIG. 2) and the first stiffener 220 removed. The isometric inner views illustrated in FIGS. 3A and 3B, expose components between the first PWB 110a (FIG. 2) and the second PWB 110b. The transformer mounting plate 140 sits in a slot 1010 of the second stiffener 130. As illustrated in FIG. 3A, the first stiffener 220 comprises a plurality of openings 221 and the second stiffener 130 comprises a plurality of openings 131. A number of openings 221 of the first stiffener 220 is equivalent to a number of openings 131 in the second stiffener 130. The openings 221 of the first stiffener 220 align with the openings 131 in the second stiffener 130, as illustrated in FIG. 3A. As illustrated in FIG. 3A, the first stiffener 220 may have sixteen openings 221 but it is understood that the first stiffener 220 may have any number of openings 221. As illustrated in FIGS. 3A and 3B, the second stiffener 130 may have sixteen openings 131 but it is understood that the second stiffener 130 may have any number of openings 131.

Although obscured from visibility in FIG. 3A but visible in FIG. 3B, the planar transformer 300 is located within an opening 131a of the second stiffener 130 and an opening 221a of the first stiffener 220. In FIG. 3A, a machined metallic section cover 222 of the first stiffener 220 covers the opening 221a of the first stiffener 220 where the planar transformer 300 is located. The machined metallic section cover 222 is interposed between the planar transformer 300 (see FIG. 3B) and the first PWB 110a (see FIG. 2). The machined metallic section of the first stiffener 220 removes heat from a first core 460 (see FIG. 4B) of the planar transformer 300.

Figure 4B:
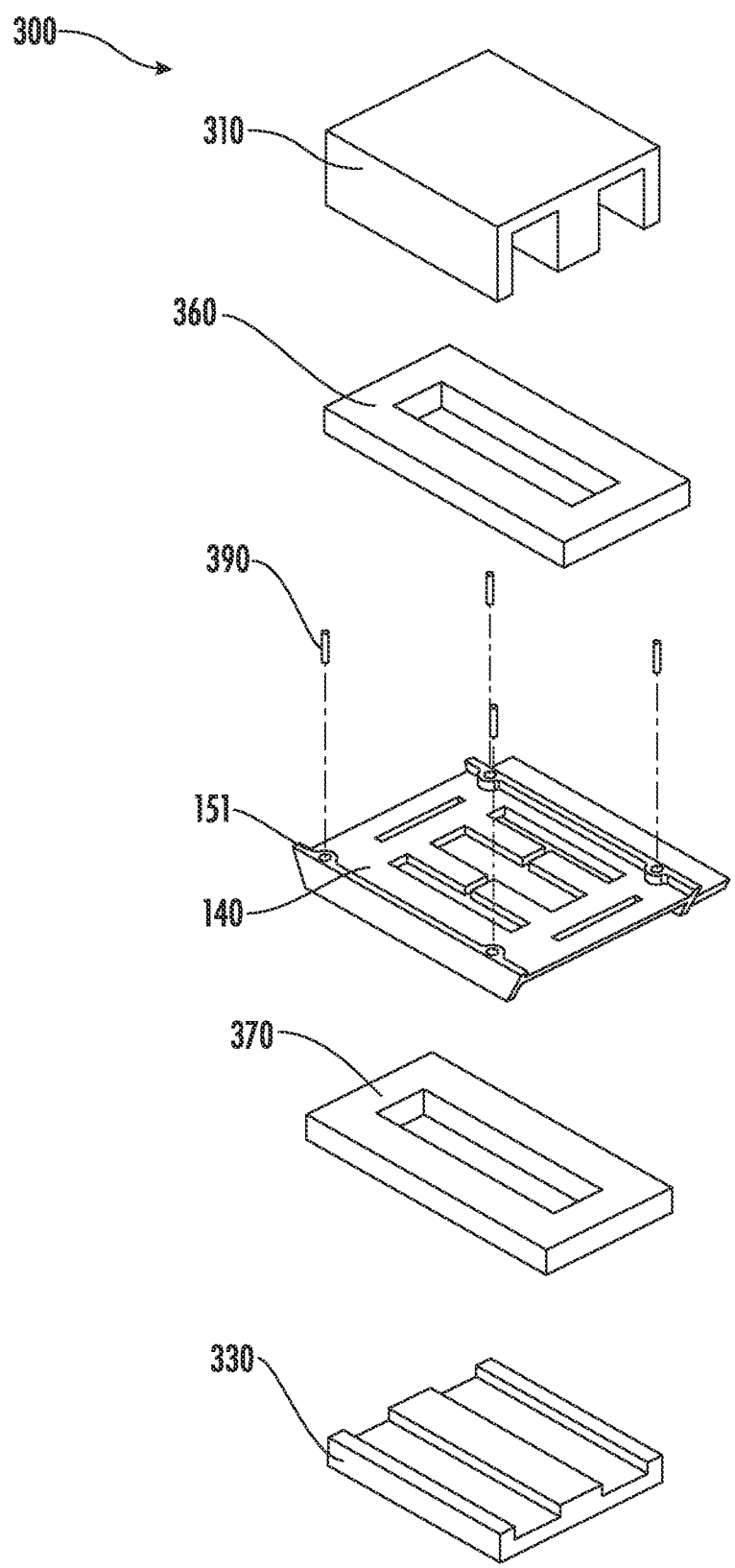
FIG. 4B illustrates an exploded view of the transformer mounting plate and the planar transformer of FIG. 4A, in accordance with an embodiment of the present disclosure.

Referring now to FIGS. 4A and 4B, with continued reference to the previous FIGS., the planar transformer 300 and the transformer mounting plate 140 are illustrated in further detail, in accordance with one or more embodiments of the present disclosure. FIG. 4A illustrates an isometric view of the planar transformer 300 assembled with the transformer mounting plate 140. FIG. 4B illustrates an exploded view of the planar transformer 300 and the transformer mounting plate 140. The planar transformer 300 comprises a first core 310, a second core 330, a first winding 360, and a second winding 370. It is understood that while the transformer 300 is illustrated and described herein with two windings (e.g., a first winding 360 and a second winding 370) the embodiments disclosed herein may also be application a planar transformer 300 having any number of windings including but not limited to one winding, or greater than two windings. The terms "first" and "second" are used only for explanatory purposes and do not limit the orientation of the two-card assembly 100 in any way. The second core 330 is located opposite the first core 310. FIG. 4B also illustrates, fasteners 390 that may be inserted into openings 151 of the transformer mounting plate 140 to secure the transformer mounting plate 140 and planar transformer 300 to the second stiffener 130 (FIG. 3B). The fasteners 390 may be threaded fasteners such as, for example, screws or bolts.

Figure 5A:
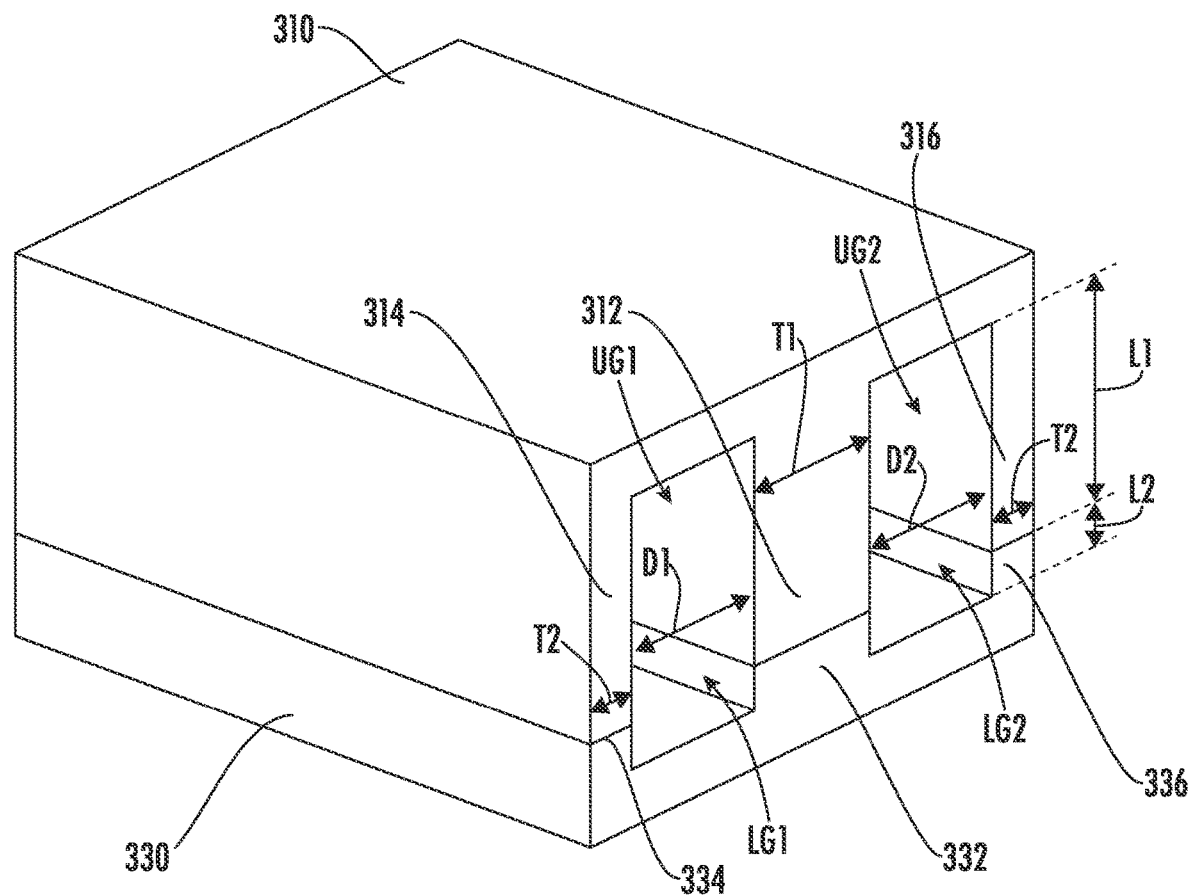
FIG. 5A illustrates an isometric view of a first core and a second core of the planar transformer of FIGS. 4A and 4B, in accordance with an embodiment of the present disclosure.
Figure 5B:
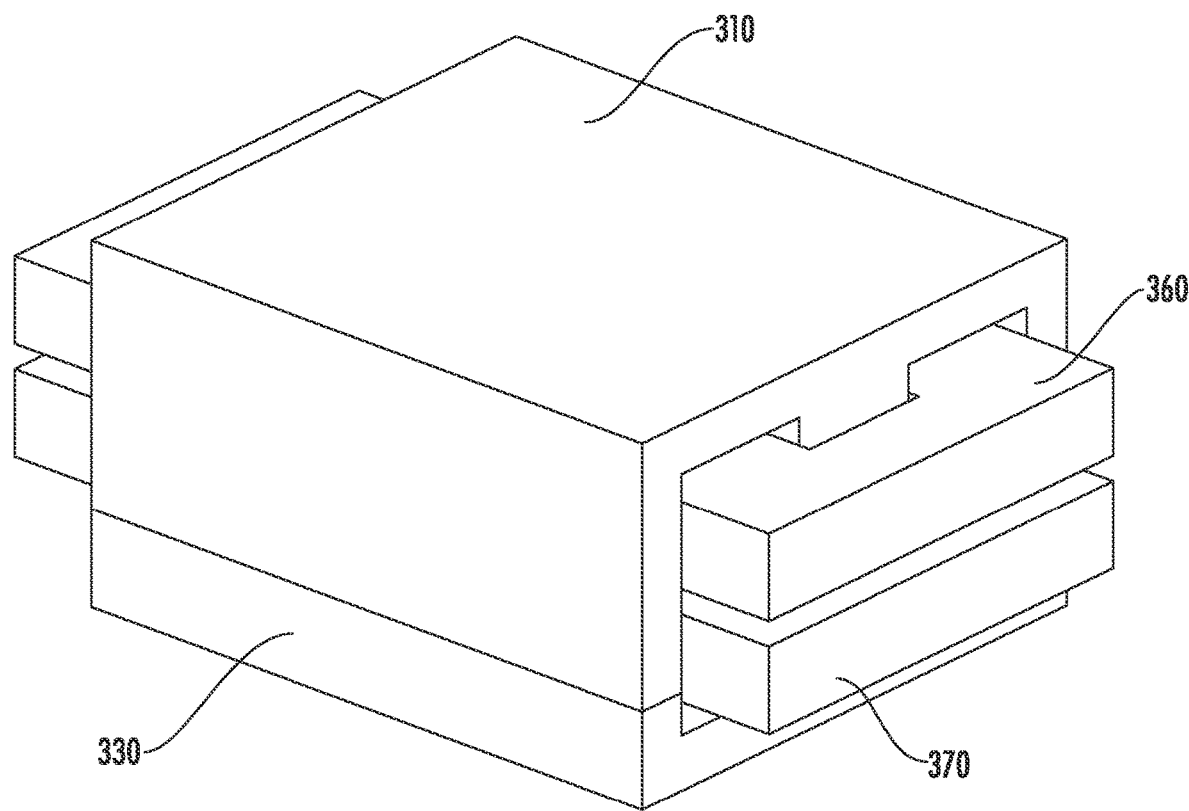
FIG. 5B illustrates an isometric view of the first core, the second core, a first winding, and a second winding of the planar transformer of FIGS. 4A and 4B, in accordance with an embodiment of the present disclosure.

Referring now to FIGS. 5A and 5B, with continued reference to the previous FIGS., the first core 310, the second core 330, the first winding 360, and the second winding 370 are illustrated, in accordance with an embodiment of the present disclosure. The first core 310 includes a central core leg 312, a first outer core leg 314, and a second outer core leg 316 located opposite the first outer core leg 314. The central core leg 312 is interposed between the first outer core leg 314 and the second outer core leg 316, as illustrated in FIGS. 5A and 5B. The central core leg 312 is separated from the first outer core leg 314 by a first upper gap UG1 having a first distance D1 as measured from the central core leg 312 to the first outer core leg 314. The central core leg 312 is separated from the second outer core leg 316 by a second upper gap UG2 having a second distance D2 as measured from the central core leg 312 to the second outer core leg 316. In an embodiment, the first distance D1 is equivalent to the second distance D2. The magnitudes of the first distance D1 and the second distance D2 are dependent on specific transformer design, and thus the first distance D1 and the second distance D2 may vary with each design.

The central core leg 312 may have a first thickness T1, the first outer core leg 314 may have a second thickness T2, and the second outer core leg 316 may have the second thickness T2. In an embodiment, the first thickness T1 is equal to twice the second thickness T2. The central core leg 312 carries the sum of the flux of the first outer core leg 314 and the second outer core leg 316 and hence, it is twice the cross-sectional area of each of the first outer core leg 314 and the second outer core leg 316. The magnitudes of the first thickness T1 and the second thickness T2 are dependent on specific transformer design, and thus the first thickness T1 and the second thickness T2 may vary with each design.

The second core 330 includes a central core leg 332, a first outer core leg 334, and a second outer core leg 336 located opposite the first outer core leg 334. The central core leg 332 is interposed between the first outer core leg 334 and the second outer core leg 316, as illustrated in FIGS. 5A and 5B. The central core leg 332 is separated from the first outer core leg 334 by a first upper gap LG1 having a first distance D1 as measured from the central core leg 332 to the first outer core leg 334. The central core leg 332 is separated from the second outer core leg 336 by a second lower gap LG2 having a second distance D2 as measured from the central core leg 332 to the second outer core leg 336. In an embodiment, the first distance D1 is equivalent to the second distance D2.

The central core leg 332 may have the first thickness T1, the first outer core leg 334 may have the second thickness T2, and the second outer core leg 336 may have the second thickness T2. In an embodiment, the first thickness T1 is equal to twice the second thickness T2. The central core leg 332 carries the sum of the flux of the first outer core leg 334 and the second outer core leg 336 and hence, it is twice the cross-sectional area of each of the first outer core leg 334 and the second outer core leg 336. The magnitudes of the first thickness T1 and the second thickness T2 are dependent on specific transformer design, and thus the first thickness T1 and the second thickness T2 may vary with each design.

The central core leg 312, the first outer core leg 314, and the second outer core leg 316 may each have a length equivalent to a first length L1. The central core leg 332, the first outer core leg 334, and the second outer core leg 336 may each have a length equivalent to a second length L2. In an embodiment, the first length L1 is greater than the second length L2. The first core 310 generates more heat than the second core 330 because the first length L1 is greater than the second length L2. The magnitude of the first length L1 and the second length L2 depend on specific transformer design, and thus the first length L1 and the second length L2 may vary with each design.

As illustrated in FIG. 5A, the central core leg 312 of the first core 310 aligns with the central core leg 332 of the second core 330, the first outer core leg 314 of the first core 310 aligns with the first outer core leg 334 of the second core 330, and the second outer core leg 316 of the first core 310 aligns with the second outer core leg 336 of the second core 330.

As illustrated in FIG. 5B, the first winding 360 is interposed between the first core 310 and the transformer mounting plate 140. The first winding 360 is wrapped circumferentially around the central core leg 312 of the first core 310. The first winding 360 extends through the first upper gap UG1 and the second upper gap UG2. The second winding 370 is interposed between the second core 330 and the transformer mounting plate 140. The second winding 370 is wrapped circumferentially around the central core leg 312 of the first core 310 and the central core leg 332 of the second core 330. The second winding 370 extends through the first upper gap UG1, the second upper gap UG2, the first lower gap LG1, and the second lower gap LG2.

Figure 6A:
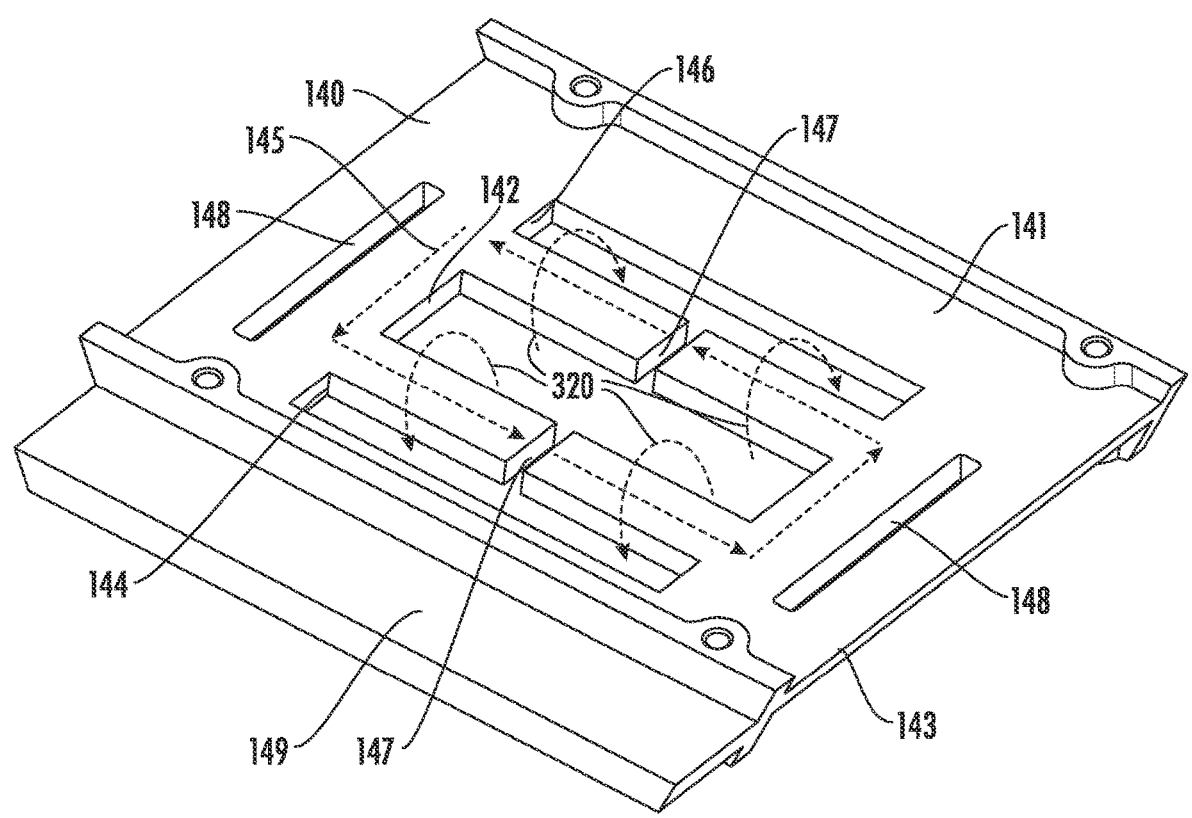
FIG. 6A illustrates an isometric view of the transformer mounting plate of FIGS. 4A and 4B, in accordance with an embodiment of the present disclosure.
Figure 6B:
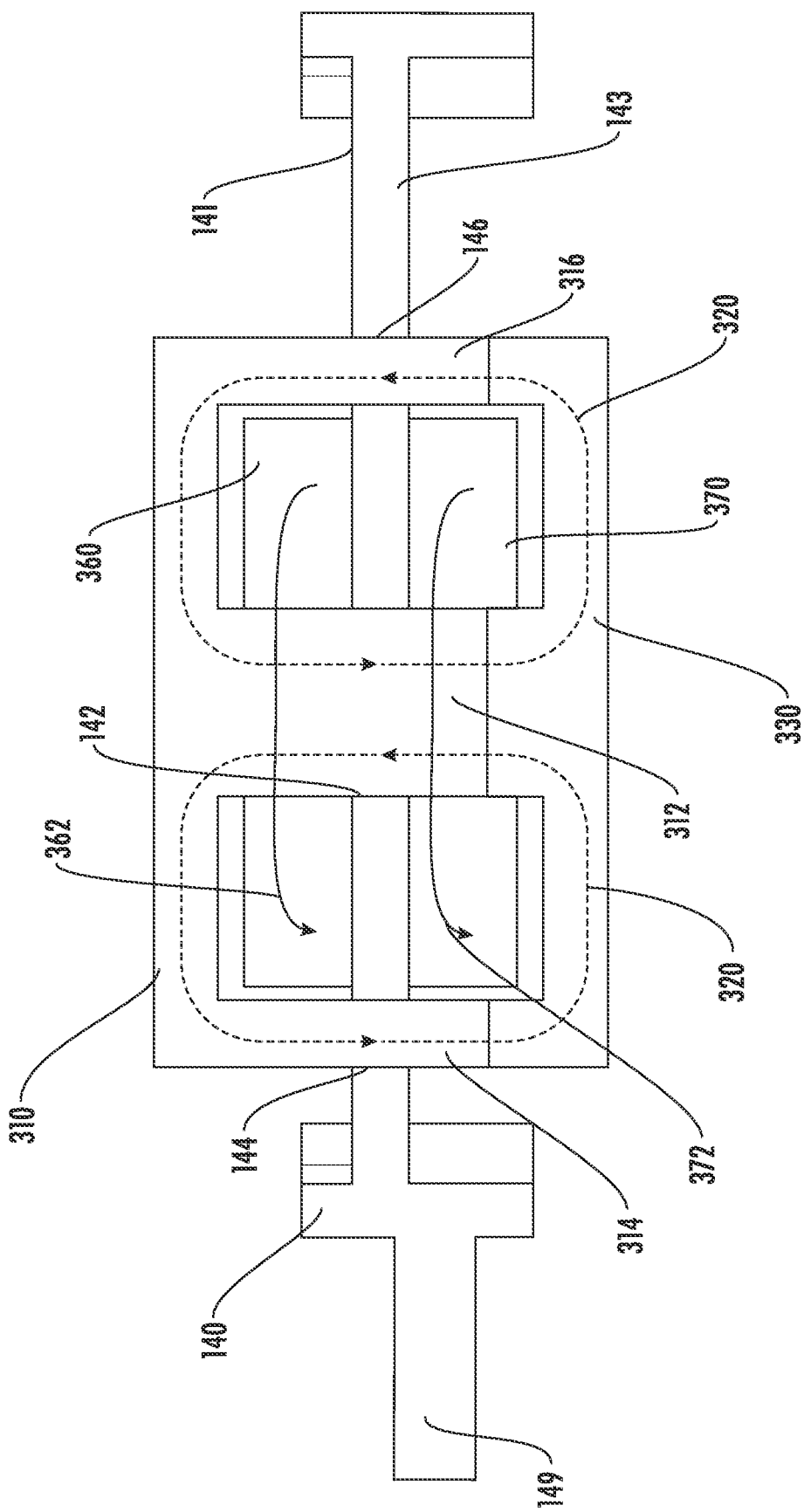
FIG. 6B illustrates a cross-sectional view of the transformer mounting plate and the planar transformer of FIGS. 4A and 4B, in accordance with an embodiment of the present disclosure.

Referring now to FIGS. 6A and 6B, with continued reference to the previous FIGS., the transformer mounting plate 140 is illustrated, in accordance with an embodiment of the present disclosure. The transformer mounting plate 140 includes a first surface 141 and a second surface 143 opposite the first surface 141. The first surface 141 and the second surface 143 are each planar surfaces that may be parallel to each other. The transformer mounting plate 140 includes a central opening 142, a first outer opening 144, and a second outer opening 146. The central opening 142 is interposed between the first outer opening 144 and the second outer opening 146. The central opening 142 extends from the first surface 141 to the second surface 143 passing completely through the transformer mounting plate 140. The first outer opening 144 extends from the first surface 141 to the second surface 143 passing completely through the transformer mounting plate 140. The second outer opening 146 extends from the first surface 141 to the second surface 143 passing completely through the transformer mounting plate 140.

The central opening 142 is configured to fit the central core leg 312 of the first core 310 within the central opening 142. The central core leg 312 extends through the central opening 142. The first outer opening 144 is configured to fit the first outer core leg 314 of the first core 310 within the first outer opening 144. The first outer core leg 314 extends through the first outer opening 144. The second outer opening 146 is configured to fit the second outer core leg 316 of the first core 310 within the second outer opening 146. The second outer core leg 316 extends through the second outer opening 146. The transformer mounting plate 140 also includes winder openings 148 configured to fit electrical connectors for the first winding 360 and the second winding 370. The transformer mounting plate 140 further includes a wedge lock mounting rail 149.

The transformer mounting plate 140 also includes one or more slots 147 The slot 147 connects the central opening 142 to at least one of the first outer opening 144, the second outer opening 146, and one of the winder openings 148. The slot 147 extends from the first surface 141 to the second surface 143 passing completely through the transformer mounting plate 140. There can be just one slot 147.

The presence of a current flow 362 in the first winding 360 induces a magnetic flux 320 in the first core 310 and the second core 330. When the current flow 362 changes in the first winding 360 the magnetic flux 320 generated is proportional to the change in the current flow 362. The magnetic flux 320 induces a current 372 in the second winding 370 through electromagnetic induction. When the magnetic flux 320 changes the current flow 372 generated is proportional to the change in the magnetic flux 320.

In an embodiment, the transformer mounting plate 140 is composed of a non-ferrous material. The first winding 360 and the second winding 370 are in contact with the transformer mounting plate 140. The contact may be direct contact or utilizing a thermally conductive intermediary. The magnetic flux 320 would also generate a current flow 145 in the transformer mounting plate 140 if a slot 147 were not present. Advantageously, the slot 147 interrupts the current flow 145 in the transformer mounting plate 140 that would be generated by the magnetic flux 320. Further advantageously, the slot 147 prevents any current flow 145 in the transformer mounting plate 140 from interfering with the electromagnetic induction occurring from the first winding 360 to the first core 310 and the second core 330 and then from the first core 310 and the second core 330 to the second winding 370.

Figure 7A:
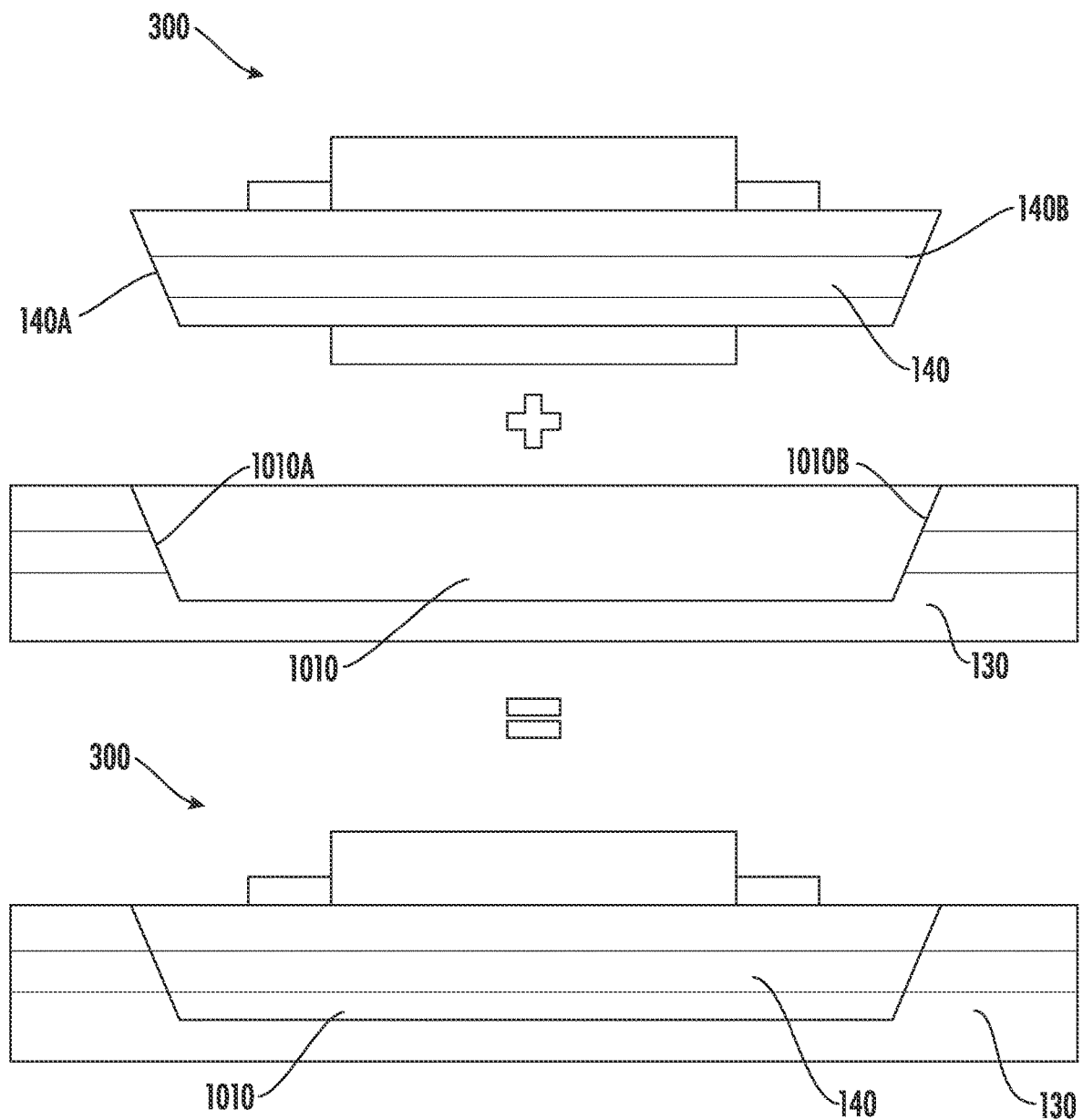
FIG. 7A illustrates a side view of assembling the transformer mounting plate and the planar transformer of FIGS. 4A and 4B into a second stiffener, in accordance with an embodiment of the present disclosure.
Figure 7B:
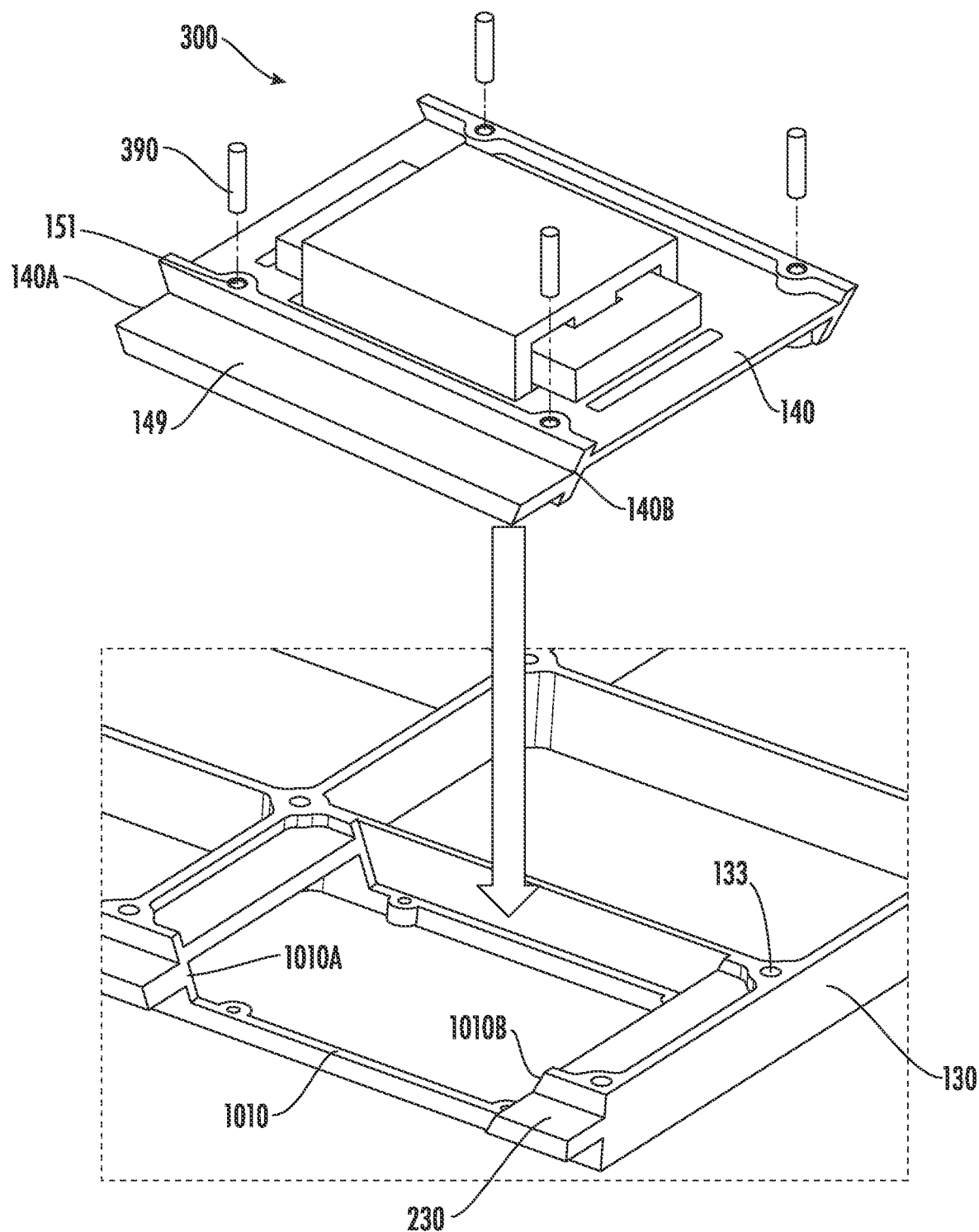
FIG. 7B illustrates an isometric view of assembling the transformer mounting plate and the planar transformer of FIGS. 4A and 4B into the second stiffener, in accordance with an embodiment of the present disclosure.

Referring now to FIGS. 7A and 7B, with continued reference to the previous FIGS., an assembly process of the second stiffener 130, the transformer mounting plate 140, and the planar transformer 300 is illustrated in accordance with an embodiment of the present disclosure. FIG. 7A illustrates a side view of the assembly process and FIG. 7B illustrates an isometric view of the assembly process. The planar transformer 300 is mounted on the transformer mounting plate 140 and then the transformer mounting plate 140 and the planar transformer 300 is inserted into the slot 1010. The slot 1010 may include a first angled side 1010*a* and a second angled side 1010*b*. The transformer mounting plate 140 may include a first angled side 140*a* and a second angled side 140*b*. The first angled side 1010*a* of the slot 1010 is shaped to mirror/match the first angled side 140*a* of the transformer mounting plate 140 and the second angled side 1010*b* of the slot 1010 is shaped to mirror/match the second angled side 140*b* of the transformer mounting plate 140. The first angled side 1010*a* of the slot 1010 may be shaped to mirror/match the first angled side 140*a* of the transformer mounting plate 140 and the second angled side 1010*b* of the slot 1010 may be shaped to mirror/match the second angled side 140*b* of the transformer mounting plate 140, such that a snug fit is achieved between the transformer mounting plate 140 and the slot 1010. Advantageously, the first angled side 1010*a* of the slot 1010, first angled side 140*a* of the transformer mounting plate 140, the second angled side 1010*b* of the slot 1010, and the second angled side 140*b* of the transformer mounting plate 140 help guide the transformer mounting plate 140 into the slot 1010 during assembly of the transformer mounting plate 140 and the second stiffener 130.

Once the transformer mounting plate 140 and the planar transformer 300 are installed in the slot 1010 of the second stiffener 130, then fasteners 390 may be inserted into openings 151 of the transformer mounting plate 140 and threaded openings 133 of the second stiffener 130 to secure the transformer mounting plate 140 and the planar transformer 300 to the second stiffener 130. Once the transformer mounting plate 140 and the planar transformer 300 is installed in the slot 1010 of the second stiffener 130, the wedge lock mounting rail 149 of the transformer mounting plate 140 will align with the wedge lock mount rail 230 of the second stiffener 130 (see FIGS. 8A and 8B)

Figure 8A:
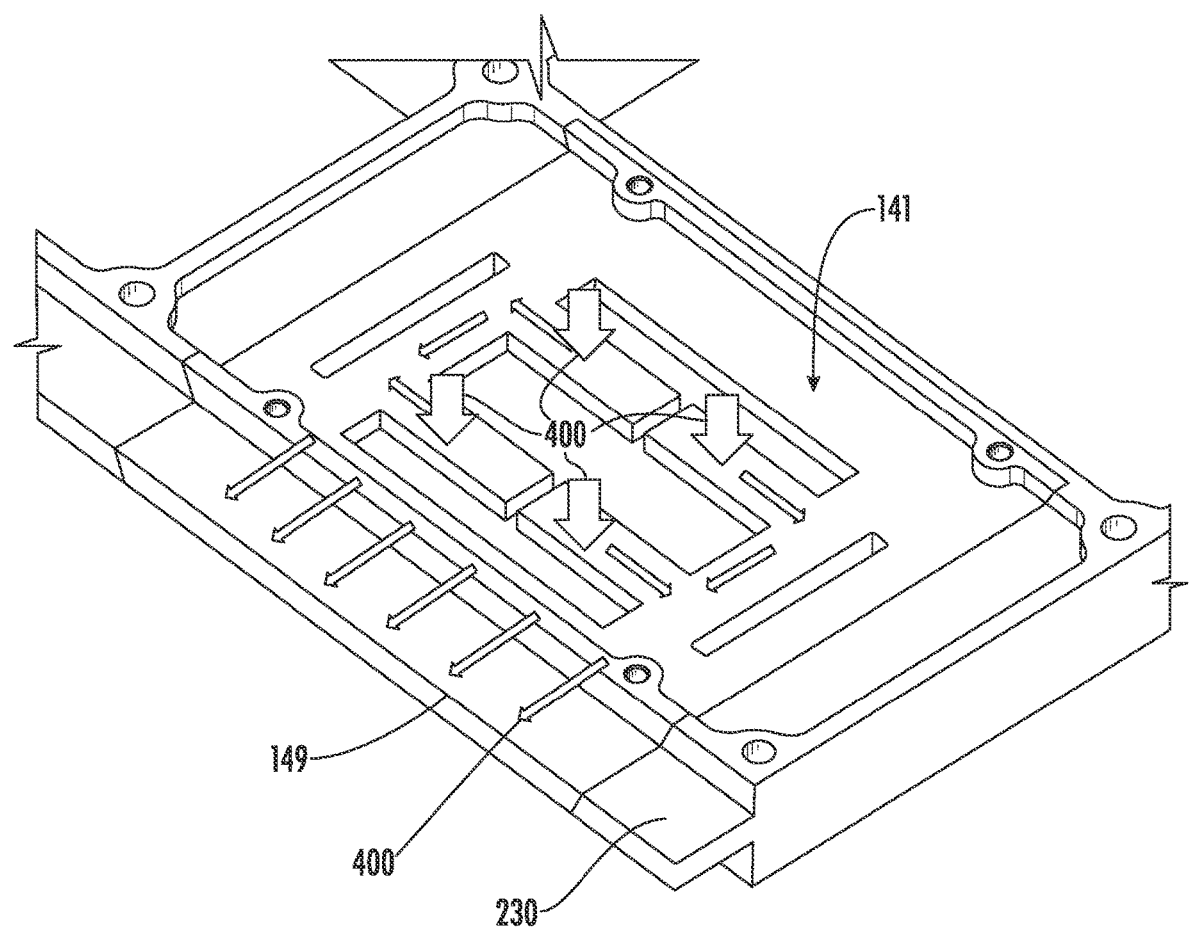
FIG. 8A illustrates an isometric top view of heat flow in the transformer mounting plate, in accordance with an embodiment of the present disclosure.
Figure 8B:
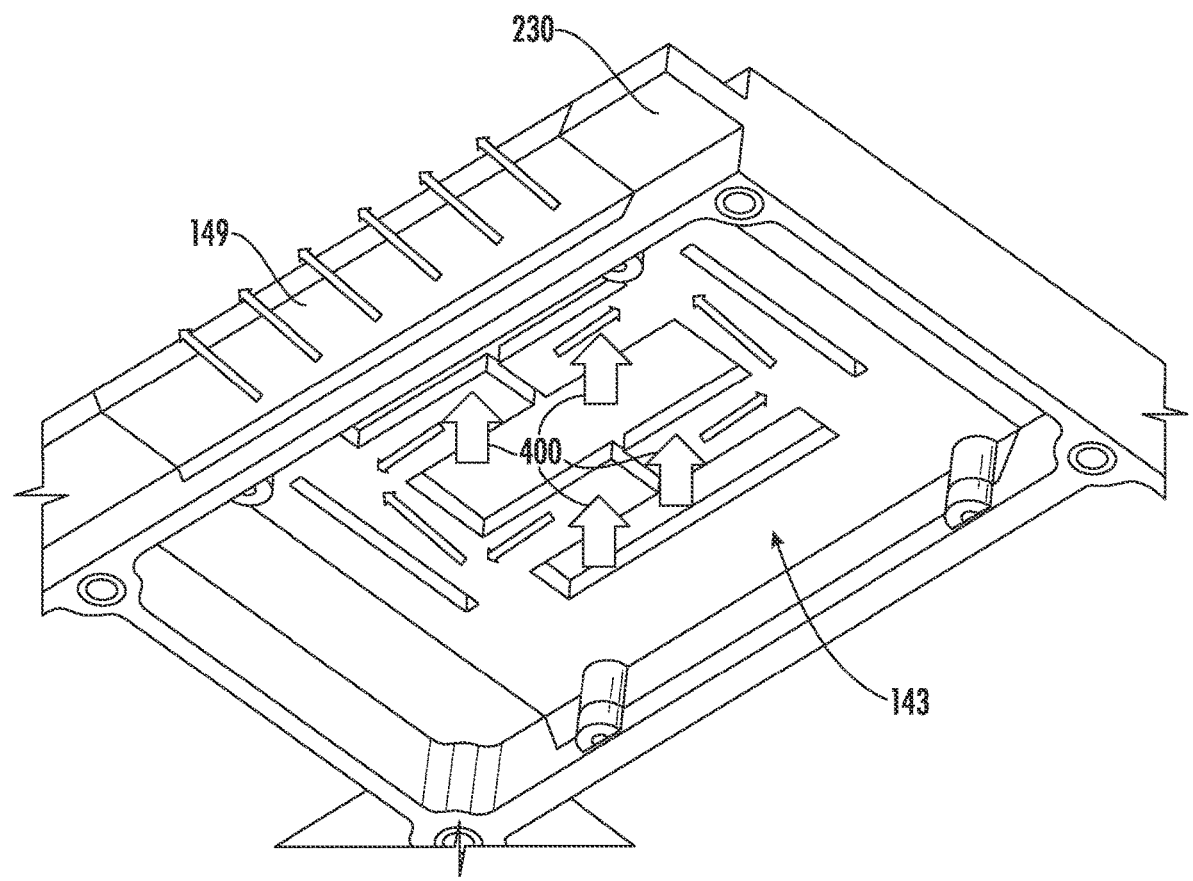
FIG. 8B illustrates an isometric bottom view of heat flow within the transformer mounting plate, in accordance with an embodiment of the present disclosure.
Figure 8C:
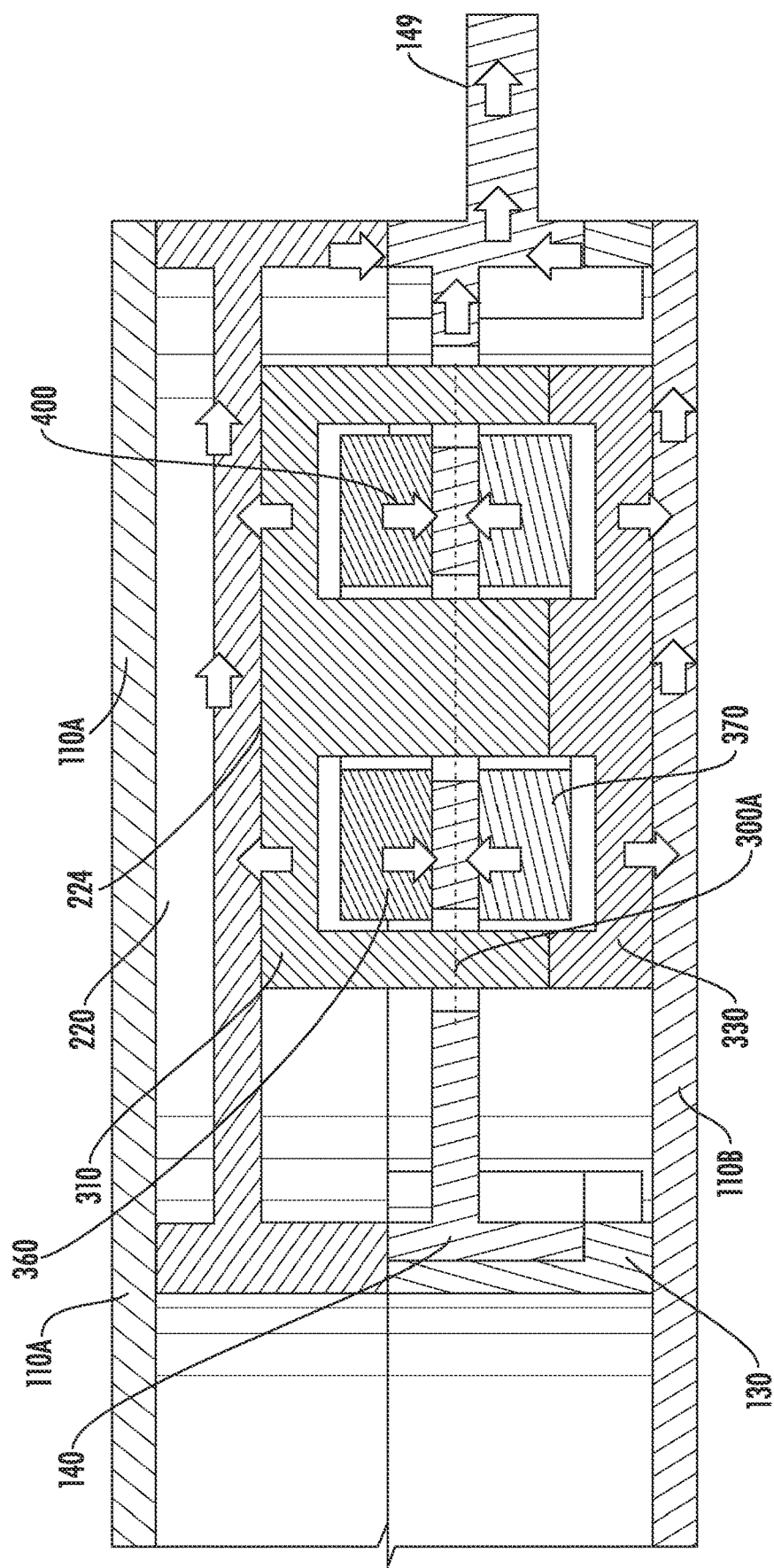
FIG. 8C illustrates a cross-sectional view of heat flow within the two-card assembly, in accordance with an embodiment of the present disclosure.

Referring now to FIGS. 8A, 8B, and 8C, with continued reference to the previous FIGS., a heat 400 path through the transformer mounting plate 140 is illustrated, in accordance with an embodiment of the present disclosure. FIG. 8A illustrates a top view of the transformer mounting plate 140. FIG. 8B illustrates a bottom view of the transformer mounting plate 140. FIG. 8C illustrates a cross-sectional view of the two card assembly 100.

A byproduct of current flows 362, 372 (see FIG. 6B) through the first winding 360 and the second winding 370 is heat 400. The heat 400 generated from the first winding 360 and the second winding 370 is dissipated through the transformer mounting plate 140. The first winding 360 is in contact with the first surface 141 of the transformer mounting plate 140. The contact may be direct contact or utilizing a thermally conductive intermediary. The second winding 370 is in contact with the second surface 143 of the transformer mounting plate 140. The contact may be direct contact or utilizing a thermally conductive intermediary. As illustrated in FIGS. 8A and 8C, heat 400 generated by the first winding 360 is transferred from the first winding 360 to the first surface 141 of the transformer mounting plate 140 and then the heat 400 is conducted through the transformer mounting plate 140 to the wedge lock mounting rail 149 of the transformer mounting plate 140 and the wedge lock mount rail 230. The temperature of the wedge lock mount rail 230 and the wedge lock mounting rail 149 may be controlled by a heat sink (e.g., convective heat sink, radiative heat sink, a combination of the two), for example.

As illustrated in FIGS. 8B and 8C, heat 400 generated by the second winding 370 is transferred from the second winding 370 to the second surface 143 of the transformer mounting plate 140 and then the heat 400 is conducted through the transformer mounting plate 140 to the wedge lock mounting rail 149 of the transformer mounting plate 140 and the wedge lock mount rail 230.

A byproduct of a magnetic flux 320 (see FIG. 6B) generated in the first core 310 and the second core 330 is heat 400. The first core 310 is at least partially located within a cavity 224 of the first stiffener 220. The first core 310 is in contact with the first stiffener 220 within the cavity 224 and heat 400 generated by the first core 310 is transferred to the first stiffener 220 and is conducted through the first stiffener 220 to the transformer mounting plate 140 and eventually the wedge lock mount rail 230.

The second core 330 is in contact with the second PWB 110*b* and heat 400 generated by the second core 330 is transferred to second PWB 110*b* and is conducted through the second PWB 110*b* to the second stiffener 130, the transformer mounting plate 140, and eventually the wedge lock mount rail 230.

Advantageously, the transformer mounting plate 140 dissipates heat 400 from a center 300*a* of the planar transformer 300, where in previous configurations heat removal from planar transformers would have to transpire through only the first core 310 or the second core 330. Further advantageously, the transformer mounting plate 140 is composed a metallic material that draws heat into itself and then conducts the heat to the wedge lock mounting rail 149 of the transformer mounting plate 140 and the wedge lock mount rail 230.

The first core 310 and the second core 330 differ in size due to thermal consideration. The first core 310 is in contact with the first stiffener 220, and the second core 330 is in contact with the second PWB 110*b*. The first stiffener 220 is made of a thermally conductive material such as aluminum alloy, which has a very high thermal conductivity compared to a PWB. Due to its higher thermal conductivity, the first stiffener 220 dissipate more heat 400 compared to a PWB. The first core 310 generates more heat 400 due to its larger size compared to the second core 330. The first stiffener 220 removes that heat 400 from the first core 310.

Figure 9:
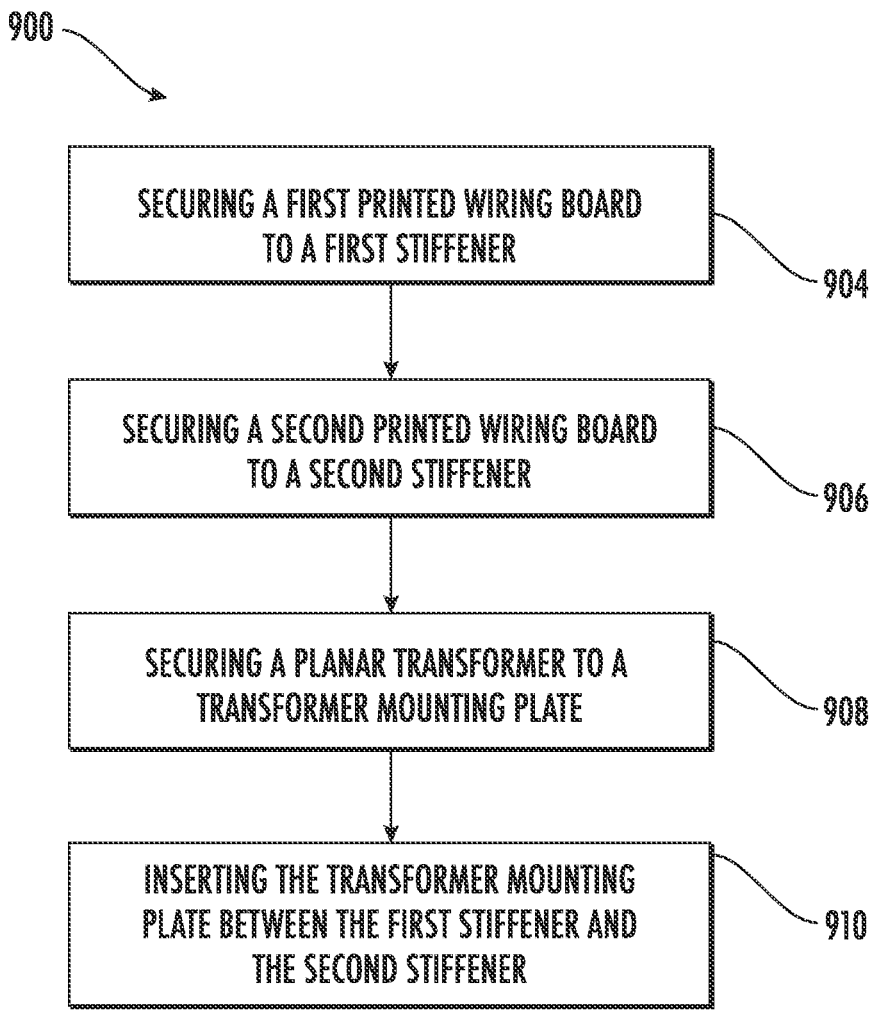
FIG. 9 illustrates a flow chart of a method of assembling the two-card assembly, in accordance with an embodiment of the present disclosure.
Figure 10:
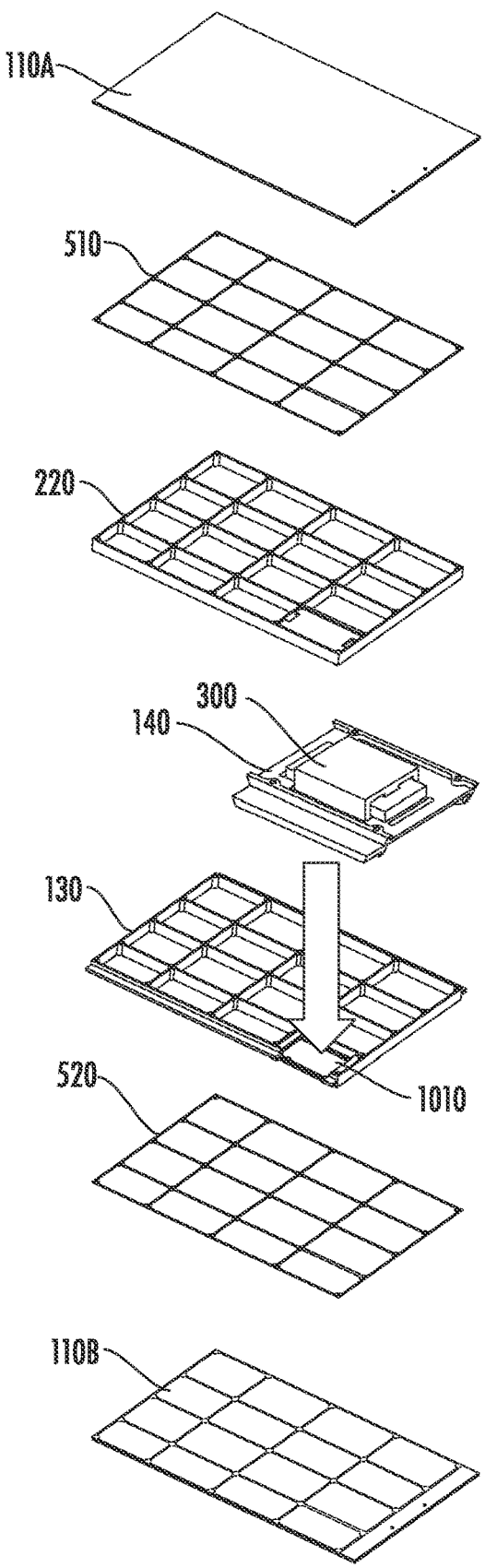
FIG. 10 illustrates an exploded view of the two-card assembly, in accordance with an embodiment of the present disclosure.

Referring now to FIGS. 9 and 10, with continued reference to the previous FIGS., a method 900 of assembling a two-card assembly 100 is illustrated in FIG. 9 and an exploded view of the two-card assembly 100 is illustrated in FIG. 10, in accordance with an embodiment of the present disclosure. At block 904, a first PWB 110*a* is secured to a first stiffener 220. The first PWB 110*a* may be secured to the first stiffener 220 via an adhesive 510. At block 906, a second PWB 110*b* is secured to a second stiffener 130. The second PWB 110*b* may be secured to the second stiffener 130 via an adhesive 520. At block 908, a planar transformer 300 is secured to a transformer mounting plate 140. At block 910, the transformer mounting plate 140 is inserted between the first stiffener 220 and the second stiffener 130. The transformer mounting plate 140 dissipates heat 400 from the planar transformer 300.

The method 900 may further comprise that the transformer mounting plate 140 is inserted into a slot 1010 of the second stiffener 130. The method 900 may also comprise that the transformer mounting plate 140 is secured in the slot 1010 of the second stiffener 130 using fasteners 390. The method 900 may yet further comprise: fabricating the transformer mounting plate 140. The transformer mounting plate 140 comprises a first surface 141, a second surface 143 opposite the first surface 141, a central opening 142 extending from the first surface 141 to the second surface 143, a first outer opening 144 extending from the first surface 141 to the second surface 143, and a second outer opening 146 extending from the first surface 141 to the second surface 143. The central opening 142 is interposed between the first outer opening 144 and the second outer opening 146.

The method 900 may also comprise that a central core leg 312 of a first core 310 is inserted into the central opening 142, a first outer core leg 314 of the first core 310 is inserted into the first outer opening 144, and a second outer core leg 316 of the first core 310 is inserted into the second outer opening 146.

The method 900 may further comprise: that a first winding 360 is wrapped circumferentially around the central core leg 312 of the first core 310 and a second winding 370 is wrapped circumferentially around the central core leg 312 of the first core 310. In an embodiment, the first winding 360 is in contact in the first surface 141 of the transformer mounting plate 140 and the second winding 370 is in contact in the second surface 143 of the transformer mounting plate 140.

While the above description has described the flow processes of FIG. 9 in a particular order for explanatory purposes, it should be appreciated that unless otherwise specifically required in the attached claims that the ordering of the steps may be varied.

A detailed description of one or more embodiments of the disclosed apparatus and method are presented herein by way of exemplification and not limitation with reference to the Figures.

The term "about" is intended to include the degree of error associated with measurement of the particular quantity based upon the equipment available at the time of filing the application.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A two-card assembly comprising:
    a first printed wiring board;
    a second printed wiring board;
    a first stiffener secured to the first printed wiring board, the first stiffener interposed between the first printed wiring board and the second printed wiring board;
    a second stiffener secured to the second printed wiring board, the second stiffener interposed between the first stiffener and second printed wiring board;
    a transformer mounting plate interposed between the first stiffener and the second stiffener; and
    a planar transformer secured to the transformer mounting plate, wherein the transformer mounting plate dissipates heat from the planar transformer;
    wherein the transformer mounting plate further comprises a wedge lock mounting rail;
    wherein the second stiffener further comprises a wedge lock mount rail, the wedge lock mounting rail of the transformer mounting plate aligns with the wedge lock mount rail of the second stiffener.

2. The two-card assembly according to claim 1, wherein the transformer mounting plate dissipates heat from a center of the planar transformer.

3. The two-card assembly according to claim 1, wherein the transformer mounting plate further comprises:
    a first surface;
    a second surface opposite the first surface;
    a central opening extending from the first surface to the second surface;
    a first outer opening extending from the first surface to the second surface; and
    a second outer opening extending from the first surface to the second surface, wherein the central opening is interposed between the first outer opening and the second outer opening.

4. The two-card assembly according to claim 3, wherein the transformer mounting plate further comprises:
    a slot extending from the first surface to the second surface, the slot connects the central opening to at least one of the first outer opening and the second outer opening.

5. The two-card assembly according to claim 4, wherein the planar transformer further comprises:
    a first core;
    a second core opposite the first core;
    a first winding interposed between the first core and the transformer mounting plate, the first winding being in contact with the first surface of the transformer mounting plate; and
    a second winding interposed between the second core and the transformer mounting plate, the second winding being in contact with the second surface of the transformer mounting plate.

6. The two-card assembly according to claim 5, wherein the first core further comprises:
    a central core leg extending through the central opening of the transformer mounting plate;
    a first outer core leg extending through the first outer opening of the transformer mounting plate; and a second outer leg extending through the second outer opening of the transformer mounting plate.

7. The two-card assembly according to claim 6, wherein the first winding is wrapped circumferentially around the central core leg of the first core.

8. The two-card assembly according to claim 6, wherein the second core further comprises:
- a central core leg of the second core, the central core leg of the first core aligns with the central core leg of the second core;
- a first outer core leg of the second core, the first outer core leg of the first core aligns with the first outer core leg of the second core; and
- a second outer core leg of the second core, the second outer core leg of the first core aligns with the second outer core leg of the second core.

9. The two-card assembly according to claim 8, wherein the second winding is wrapped circumferentially around the central core leg of the first core and the central core leg of the second core.

10. The two-card assembly according to claim 8, wherein the central core leg of the first core, the first outer core leg of the first core, and the second outer core leg of the first core each have a length equivalent to a first length,
wherein the central core leg of the second core, the first outer core leg of the second core, and the second outer core leg of the second core each have a length equivalent to a second length, and
wherein the first length is greater than the second length.

11. The two-card assembly according to claim 1, wherein the second stiffener further comprises a slot, the transformer mounting plate fits into the slot.

12. The two-card assembly according to claim 11, wherein the slot further comprises a first angled side and a second angled side, wherein the transformer mounting plate includes a first angled side of the transformer mounting plate and a second angled side of the transformer mounting plate, wherein the first angled side of the slot mirrors the first angled side of the transformer mounting plate and the second angled side of the slot mirrors the second angled side of the transformer mounting plate.

* * * * *